(12) United States Patent
Trezise et al.

(10) Patent No.: US 9,009,562 B2
(45) Date of Patent: Apr. 14, 2015

(54) PROVIDING MEMORY PROTECTION USING A MODIFIED ERROR CORRECTION CODE

(71) Applicant: Hewlett-Packard Development Company, L.P., Houston, TX (US)

(72) Inventors: Gregory Trezise, Wells Somerset (GB); Andrew Hana, Bristol (GB)

(73) Assignee: Hewlett-Packard Development Company, L.P., Houston, TX (US)

( * ) Notice: Subject to any disclaimer, the term of this patent is extended or adjusted under 35 U.S.C. 154(b) by 128 days.

(21) Appl. No.: 13/753,902

(22) Filed: Jan. 30, 2013

(65) Prior Publication Data

US 2014/0215289 A1    Jul. 31, 2014

(51) Int. Cl.
| | |
|---|---|
| *H03M 13/00* | (2006.01) |
| *H03M 13/05* | (2006.01) |
| *G06F 11/00* | (2006.01) |
| *H03M 13/35* | (2006.01) |
| *H03M 13/15* | (2006.01) |

(52) U.S. Cl.
CPC ............... *H03M 13/05* (2013.01); *G06F 11/00* (2013.01); *H03M 13/1515* (2013.01); *H03M 13/353* (2013.01); *H03M 13/6362* (2013.01)

(58) Field of Classification Search
CPC ....... G11C 29/00; H03M 13/00; H03M 13/05

USPC .................................................. 714/779, 758
See application file for complete search history.

(56) References Cited

U.S. PATENT DOCUMENTS

| | | | |
|---|---|---|---|
| 6,477,669 B1* | 11/2002 | Agarwal et al. ............... | 714/708 |
| 6,851,081 B2* | 2/2005 | Yamamoto .................... | 714/763 |
| 6,961,890 B2 | 11/2005 | Smith | |
| 6,986,095 B2* | 1/2006 | Maeda et al. .................. | 714/769 |
| 7,272,773 B2* | 9/2007 | Cargnoni et al. ............. | 714/763 |
| 7,739,576 B2 | 6/2010 | Radke | |
| 7,810,017 B2* | 10/2010 | Radke ........................... | 714/769 |
| 8,037,380 B2 | 10/2011 | Cagno et al. | |
| 8,296,620 B2* | 10/2012 | Chen et al. .................... | 714/758 |
| 8,352,833 B2* | 1/2013 | Pekny et al. .................. | 714/763 |
| 8,473,815 B2* | 6/2013 | Chung et al. .................. | 714/766 |
| 8,782,493 B2* | 7/2014 | Keays et al. .................. | 714/765 |
| 2011/0113303 A1 | 5/2011 | Bedeschi et al. | |
| 2012/0131422 A1 | 5/2012 | Shinbashi et al. | |

OTHER PUBLICATIONS

Micron Technical Note, TN-29-63: Error Correction Code (ECC) in SLC NAND, May 2011 (12 pages).
Seroussi, Gadiel, A Systolic Reed-Solomon Encoder, IEEE Transactions on Information Theory, vol. 37, No. 4, Jul. 1991, pp. 1217-1220.

* cited by examiner

*Primary Examiner* — Esaw Abraham
(74) *Attorney, Agent, or Firm* — Trop, Pruner & Hu, P.C.

(57) ABSTRACT

Data and a corresponding initial error correction code is written to a first portion of a memory device. Based on an error in the first data and the initial error correction code, the initial error correction code is modified.

19 Claims, 4 Drawing Sheets

PROVIDING MEMORY PROTECTION USING A MODIFIED ERROR CORRECTION CODE

BACKGROUND

In an electronic device, a memory device can be used to store data and machine-readable instructions. A memory device can include a dynamic random access memory (DRAM) device, a flash memory device, or another type of memory device. To protect data stored in the memory device, error detection and correction can be performed. Error detection and correction can be based on error correction codes that are stored in conjunction with data in the memory device.

BRIEF DESCRIPTION OF THE DRAWINGS

Some embodiments are described with respect to the following figures.

DETAILED DESCRIPTION

Errors can arise in a memory device in one of the following ways: (1) an error can occur during a write (either to a functional memory location or to a defective memory location); (2) an error can arise due to degradation of data between a write and a read; and (3) an error can arise during a read.

The various types of errors listed above can occur due to various reasons. For example, defects can occur at various locations of a memory device during the manufacture of the memory device. Also, errors in the memory device can be age-related or use-related. Over time, the memory device may deteriorate, which can lead to less reliable operation. Also, certain portions of a memory device may be used substantially more than other portions. The over used portions of the memory device may exhibit errors earlier than the less frequently used portions of the memory device.

A further source of memory error is an error caused by bit-flip, where changes in characteristics associated with a memory location can cause a data state programmed to the memory location to flip in state. Another source of memory error can be a random error during a read operation. Such random read errors can be due to noise or other factors.

A system designer may employ an error detection and correction technique (also referred to as an error correction code or ECC technique) that attempts to cover the multiple types of errors (including (1)-(3) listed above) in which memory errors can arise. Typically, the magnitude of each of the three types of errors noted above is unknown, which can make it challenging to select the appropriate ECC technique to use.

An error correction code (ECC) can be generated based on respective data that is to be written to the memory device. During a write operation, data and the corresponding ECC can be written to a block of the memory device. A "block" can refer to any logical or physical storage space in the memory device that is able to store information. During a read of the data from a given block, the corresponding ECC is retrieved for use in detecting an error in the data, and to correct the data if possible.

In some cases, to protect against all error types (1)-(3), which are of unknown magnitude, a selected ECC technique may use an ECC that has a relatively long length. However, use of an ECC of a relatively long length adds to the overall overhead associated with storage of data in the memory device. Although using an ECC of a longer length can increase the reliability of data storage (since a longer length ECC can correct larger errors in the data), such an ECC comes at the expense of reduced capacity of the memory device, since a larger portion of the memory device is used up in storing the ECC.

In accordance with some implementations, variable length ECC can be employed for different data blocks stored in a memory device. For example, a first block of the memory device can store data along with ECC of a first length, while a second block of the memory device can store data along with corresponding ECC of a second, different length. In this way, each block of the memory device uses an ECC of a length that is sufficient to address errors that may be present in the block, but which is not longer in length than the ECC has to be to provide protection for data in the block.

In accordance with some implementations, a read-after-write approach can be implemented to determine a variable length ECC to be used for data stored in each block of the memory device. Such a read-after-write approach is depicted in FIG. 1.

Figure 1:
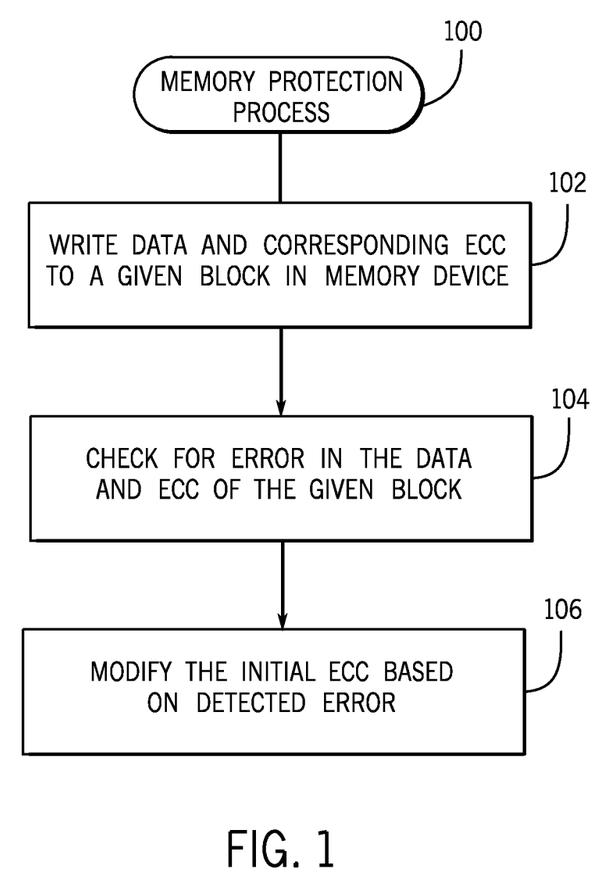
FIG. 1 is a flow diagram of a memory protection process, according to some implementations.

A memory protection process 100 of FIG. 1 writes (at 102) data and a corresponding initial ECC to a given block of the memory device. More generally, instead of referring to storing data and ECC in a block of the memory device, the data and ECC can be stored in a portion of the memory device, where the portion can refer to some amount of storage space of the memory device.

After writing the data and the corresponding ECC to the given block, the memory protection process 100 can immediately read the data from the given block and checks (at 104) for an error in the data and ECC in the given block. "Immediately" reading the data from the given block can refer to reading (at 104) the data from the given block after the write (at 102) without performing any other memory write or read operation in between. "Immediately" does not have to imply that the read (at 104) occurs some specified amount of time following the write (at 102)—"immediately" merely connotes the fact that the read (at 104) of the given block occurs following the write (at 102) of the given block without any other intervening memory read or write.

Checking (at 104) for the error in the data and ECC in the given block uses the initial ECC in the given block. By reading the data of the given block immediately following the write of the data to the given block, the memory protection process 100 can determine the magnitude of error type (1) (error occurs during a write) for the given block, and thus how much of the ECC capability would be consumed by error type (1). However, error types (2) and (3) for the given block would still be unknown at this point. Thus, given the magnitude of error type (1) determined at 104, the memory protection process 100 is able to determine an appropriate length of ECC to use for the given block to account for the known magnitude of error type (1) and the unknown magnitudes of error types (2) and (3). For example, the memory protection process 100 may determine that two bytes of ECC would have to be provided to cover error type (1) for the given block. In addition, the memory protection process 100 can specify an ECC budget for the unknown magnitudes of error types (2) and (3). For example, the ECC budget for error types (2) and (3) can be specified to be two ECC bytes. In such example, the length of ECC to use would be four bytes. In a different example, assuming the same ECC budget of two bytes for error types (2) and (3), the memory protection process 100 can use a different ECC length if the memory protection process 100 determines that one ECC byte would be sufficient to cover error type (1) for the given block—in this example, the ECC length selected would be three bytes.

Based on this determination, the memory protection process 100 modifies (at 106) the initial ECC in the given block. Note that if the length of the initial ECC is appropriate for the error detected in the data and ECC of the given block, then the initial ECC would not be modified—instead, the full length of the initial ECC would be used.

In some implementations, the modifying performed (at 106) can include truncating the initial ECC (by removing the portion of the initial ECC) or adding additional ECC to use with the initial ECC.

Truncating of the initial ECC can be performed if a truncatable ECC is used. Examples of truncatable ECC include symbol-based ECC, such as Reed-Solomon ECC. An example relating to use of a truncatable ECC is discussed below.

Consider an example where 10 data bytes are represented as bytes {A B C D E F G H I J}. Assuming Reed-Solomon ECC, the addition of two parity bytes E0 and E1, computed based on the 10 data bytes, allows for a one-byte error correction in the code word. Alternatively, four parity bytes E0, E1, E2, and E3 can be used as the ECC, which allows for correction of a larger number of bytes of error. The codeword in this case would be {A B C D E F G H I J E0 E1 E2 E3}. As yet another alternative, six parity bytes E0, E1, E2, E3, E4, and E5 can be used as the Reed-Solomon ECC, which would make the codeword {A B C D E F G H I J E0 E1 E2 E3 E4 E5}.

The initial ECC that can be stored with the 10 data bytes {A B C D E F G H I J} can be the six parity bytes {E0 E1 E2 E3 E4 E5}. Thus, the write of the data and the corresponding initial ECC performed at 102 in FIG. 1 would be of the following codeword {A B C D E F G H I J E0 E1 E2 E3 E4 E5}. If the error detected in the checking performed at 104 in FIG. 1 is a one-byte error, then that indicates that error type (1) for this block has a magnitude of one byte (which can be corrected with two parity bytes). The magnitudes of error types (2) and (3) would still be unknown at this point. Assuming that the ECC budget for error types (2) and (3) is two ECC bytes, then the ECC length to be selected would be four bytes. In this example, the initial ECC can be truncated by removing E4 and E5, such that the modified ECC includes just E0, E1, E2, and E3.

In other implementations, rather than truncating an ECC, additional ECC can be added to the given block if it is determined (in the checking performed at 104) that an error in the data and ECC written to the given block is not correctable using the initial ECC. Such implementations can be used with ECC that is not truncatable, such as a bit-based ECC. An example of a bit-based ECC is a BCH ECC.

Figure 2:
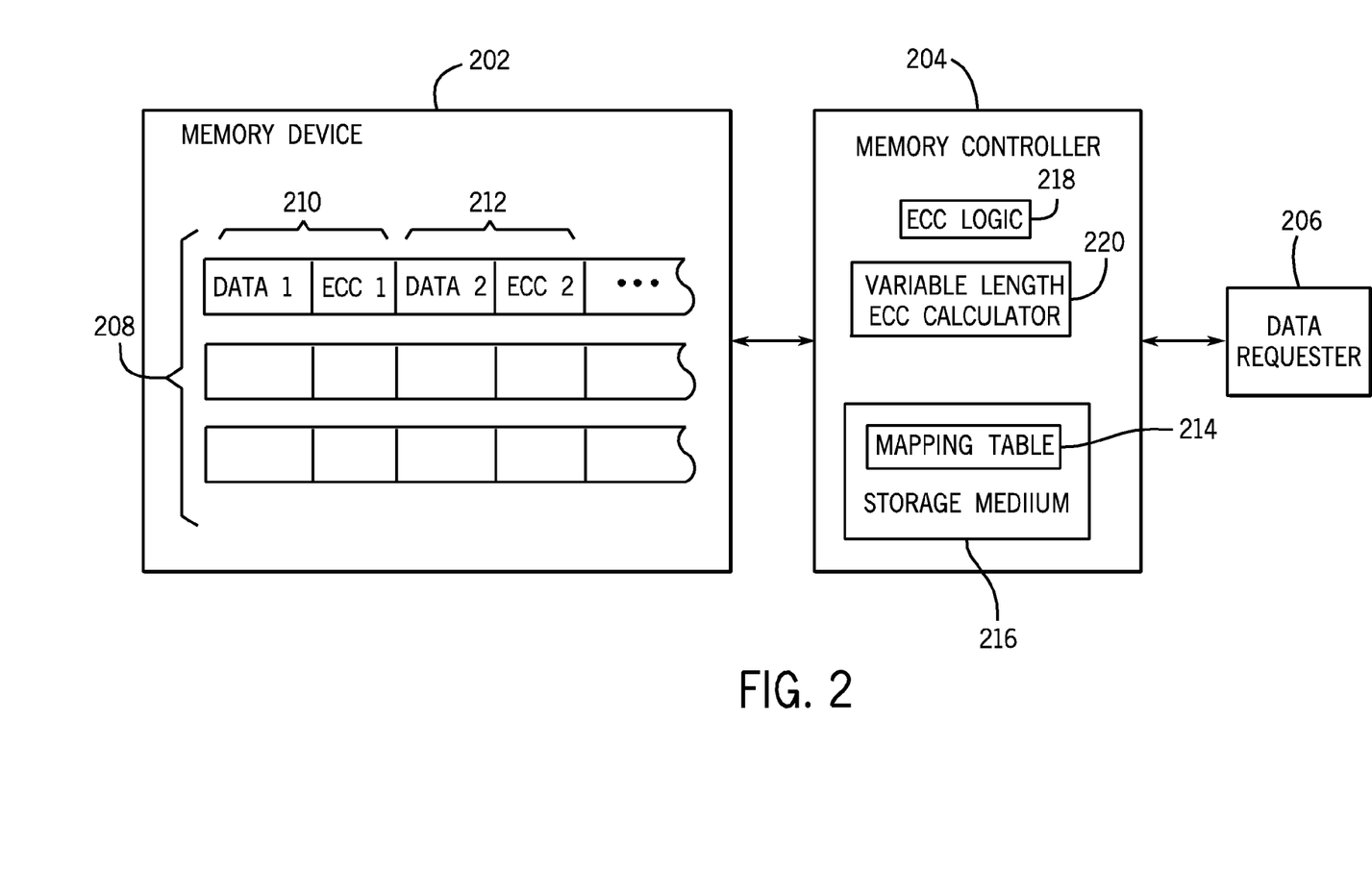
FIG. 2 is a block diagram of an example arrangement that includes a memory device, a memory controller, and a data requester, according to some implementations.

FIG. 2 is a block diagram of an example system that includes a memory device 202, a memory controller 204, and a data requester 206. Examples of the memory device 202 can include any of the following: a dynamic random access memory (DRAM) device, a static random access memory (SRAM) device, a flash memory device, or any other type of memory device.

The memory controller 204 manages the access of data stored in the memory device 202. A data requester 206 is able to submit data requests (e.g. read requests and write requests) to the memory controller 204. The data requester 206 can be a processor, an input/output (I/O) device, or any other device that is capable of accessing data stored in the memory device 202.

Although just one memory device 202 is depicted in FIG. 2, it is noted that there may be multiple memory devices present, where these memory devices can be provided in a memory module. The memory device 202, memory controller 204, and data requester 206 can be included in an electronic device, such as a computer, a smartphone, a personal digital assistant, a game appliance, a storage system, a network router or switch, or so forth.

In response to a data request from the data requester 206, the memory controller 204 issues data access commands (read commands or write commands) to the memory device 202 to access data in the memory device 202.

The memory device 202 includes a memory array 208, which includes memory locations in which data and ECC can be stored. The memory array 208 can be arranged in blocks, with two blocks 210 and 212 depicted in FIG. 2. The block 210 stores DATA1 and ECC1, while the block 212 stores DATA2 and ECC2. Note that each block is able to store a variable length ECC. In some examples, ECC1 can have a different length than ECC2, as determined using the read-after-write approach discussed above. Assuming that DATA1 and DATA2 are of the same length, then the blocks 210 and 212 would be of different lengths due to the different lengths of ECC1 and ECC2.

The block 212 used to store DATA2 and ECC2 can start at a location immediately after the block 210 in which DATA1 and ECC1 are stored. Since the overall length of a combination of data and ECC within a given block may be different from the overall length of a combination of data and ECC in another block, a mapping data structure can be maintained to keep track of the starting locations of each block and the respective length of the block. Such a mapping data structure can be in the form of a mapping table 214 stored in the memory controller 204. In alternative examples, the mapping table 214 can be stored in the memory device 202.

The mapping table 214 can include multiple entries, where each of the entries corresponds to a respective block in the memory array 208. The entry can include a starting location (physical address) of the block, and the length of the block. During a memory operation (write operation or read operation), the corresponding entry of the mapping table 214 can be retrieved by the memory controller 204 to determine where a respective block (that is the subject of the memory operation) is located, and the length of such block. For example, in response to a request to write further data to the block, a length of the ECC to use for the further data can be determined from the corresponding entry in the mapping table 214.

The blocks in the memory array 208 are associated with respective logical addresses. A given logical address maps to a respective one of the blocks. The entries of the mapping table 214 can be indexed by respective logical addresses of the blocks. A memory operation to write data or read data is performed with respect to a particular logical address. This particular logical address maps to an entry of the mapping table 214. The content of the entry of the mapping table 214 is retrieved to determine a starting location (physical address) and length of the respective block in the memory array 208.

The memory controller 204 includes a storage medium 216 to store the mapping table 214 (and other information). In addition, the memory controller 204 includes an ECC logic 218 and a variable length ECC calculator 220. The ECC logic 218 is used to generate an ECC for a respective data that is to be written to the memory device 202, during a write operation. During a read operation, the ECC logic 218 can use the ECC written to the memory device 202 to determine whether or not the combination of the data and the ECC contains an error, and if so, the ECC logic 218 can attempt to correct the error using the ECC.

The variable length ECC calculator 220 is able to vary the length of an ECC written to each block of the memory device 202. The variable length ECC calculator 220 uses the read-after-write approach noted above to determine the length of the ECC to use for each block.

The ECC logic 218 and variable length ECC calculator 220 can be implemented as hardware logic provided in the memory controller 204. Alternatively, the ECC logic 218 and variable length ECC calculator 220 can be implemented as machine-readable instructions (in the form of firmware or software) executable by processing circuitry in the memory controller 204. The memory controller 204 can be an application-specific integrated circuit (ASIC) device, a programmable gate array device, a microcontroller, a microprocessor, or any other processing device.

In some implementations, the memory controller 204 can perform sparing in response to the memory controller 204 detecting that an uncorrectable error has occurred in a particular one of the blocks. The occurrence of the uncorrectable error means that the ECC stored in the particular block is insufficient for the error that appears in the particular block. The sparing involves assigning a different physical region of the memory array 208 to store the particular block that has experienced the uncorrectable error.

Figure 3:
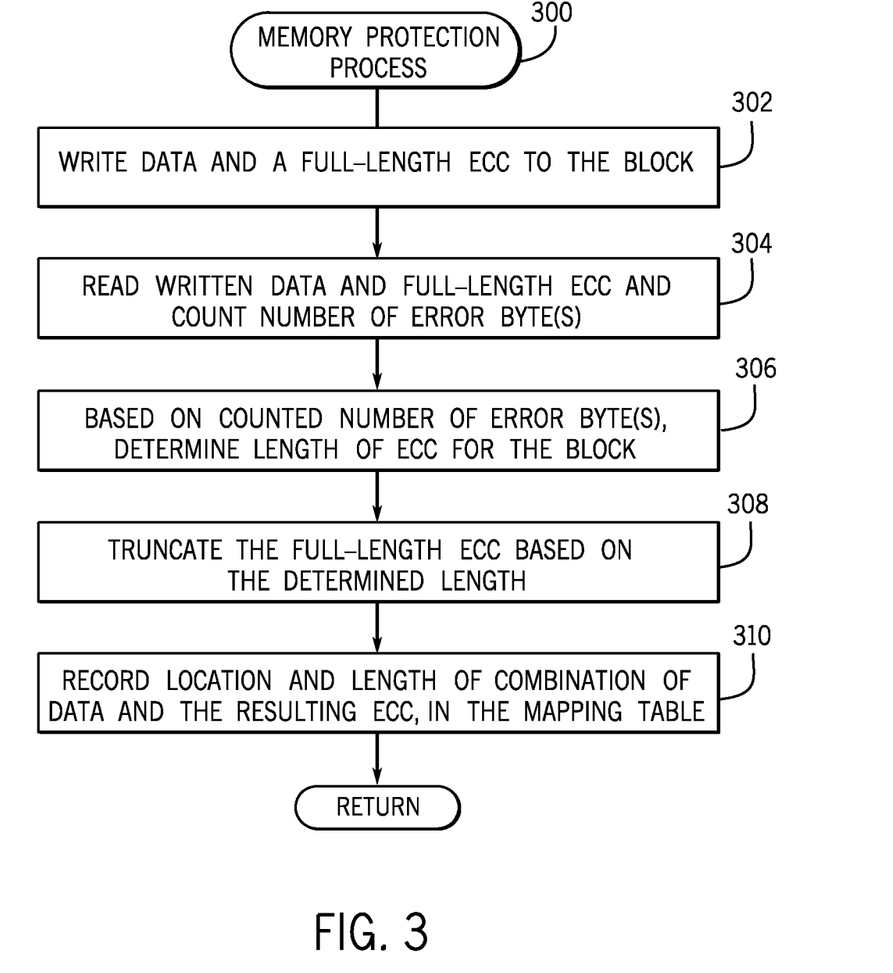
FIGS. 3 and 4 are flow diagrams of memory protection processes according to further implementations.

FIG. 3 is a flow diagram of a memory protection process 300 according to some implementations in which truncation of an initial ECC can be performed to determine a target length of the ECC to use for a given block. The memory protection process 300 is performed during a write of a given block in the memory device 202 of FIG. 2. The memory protection process 300 is re-iterated for each block of the memory device 202 during a write operation.

In some examples, the memory protection process 300 is performed for the initial writing of a virgin memory device. A virgin memory device can refer to a memory device that has previously not been used during operation of an electronic device. Alternatively, a virgin memory device can refer to a memory device whose content has been deleted to begin a new use of the memory device.

The memory protection process 300 writes (at 302) data and a full-length ECC to the block that is the subject of a current write operation. The full-length ECC can refer to an ECC of maximum length that can be used for memory protection of a block.

The memory protection process 300 next reads (at 304) the written data and full-length ECC from the block, and the number of error byte(s), if any, can be counted. The task 304 can correspond to task 104 in FIG. 1.

Based on the number of error byte(s), which can be zero or greater, the memory protection process 300 determines (at 306) a length of the ECC that is to be used to provide adequate protection for the block. This determined ECC length is the sum of the minimum length of an ECC for the counted number of error byte(s) of error type (1) determined at 304, and a length of ECC of the ECC budget for error types (2) and (3).

Based on the determined length, the full-length ECC is truncated (at 308) by the memory protection process 300. Note that truncation may not be performed if the determined length is the maximum length of the ECC. Any truncation performed at 308 corresponds to the modifying performed at 106 of FIG. 1.

Next, the memory protection process 300 records (at 310) the storage location (physical address) and length of the combination of the data and the resulting ECC for the block in the respective entry of the mapping table 214.

The memory protection process 300 then returns. When the next data and full-length ECC is written to the next block, note that the next block begins at the location that immediately follows the preceding block.

Figure 4:
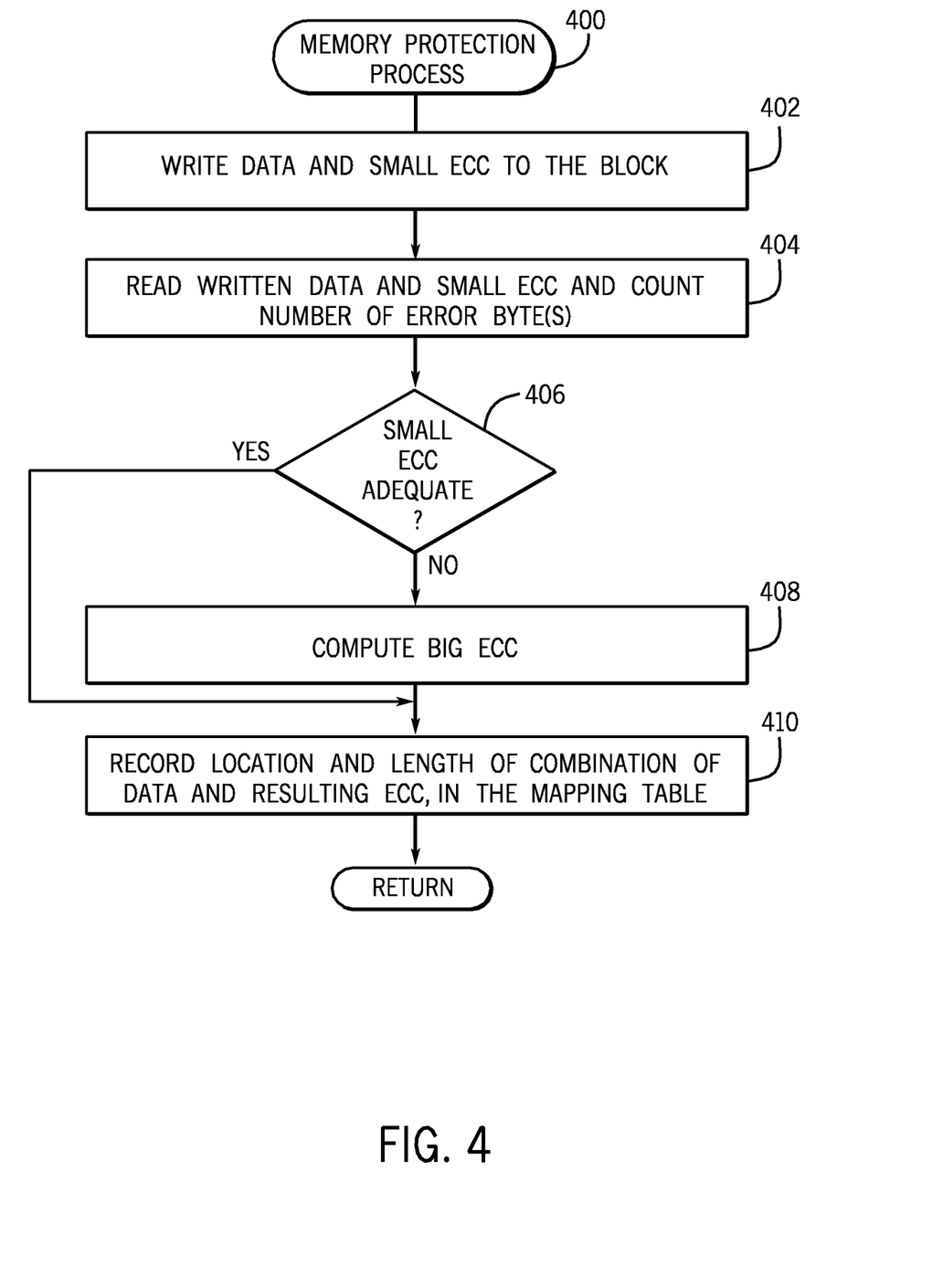

FIG. 4 is a flow diagram of a memory protection process 400 according to alternative implementations. With the memory protection process 400, truncation of an initial ECC is not employed. Instead, additional ECC can be added to an initial ECC, depending on detected errors.

The memory protection process 400 writes (at 402) data and a respective initial ECC to a given block of the memory device 202. The initial ECC can be a "small" ECC, which can refer to a shorter length ECC that is shorter than a maximum length ECC that can be used to protect data in a block.

The memory protection process 400 next reads (at 404) the written data and the small ECC, and the number of error byte(s), if any, can be counted. The memory protection process 400 determines (at 406) whether the small ECC is of sufficient length to both protect the counted number of error byte(s) of error type (1), which can be zero or greater, and cover the ECC budget for error types (2) and (3). If the small ECC is adequate to provide protection for the block, then the memory protection process 400 returns. However, if the memory protection process 400 determines that the small ECC is inadequate to provide protection for the block, then the memory protection process 400 computes (at 408) a "big" ECC, which is a larger ECC computed over the combination of the data and the small ECC. The big ECC is appended to the combination of the data and the small ECC, and stored in the block. During a subsequent read operation, the big ECC is used for performing data error detection and correction on the combination of the data and small ECC.

Next, the memory protection process 400 records (at 410) the storage location (physical address) and length of the combination of the data and the resulting ECC for the block in the respective entry of the mapping table 214.

In some examples, the memory protection process 400 can be used in the context of a serial storage device, where data is written serially to successive blocks of the memory device, and read back serially from the memory device. Since a serial storage device is not accessed randomly, the mapping table 214 of FIG. 2 does not have to be employed. Instead, each block of the serial storage device can be associated with an indicator (in the form of a prefix or suffix in the block) for indicating whether a small ECC or big ECC is used. This indicator allows the memory controller 204 to determine the length of the corresponding block.

By using variable length ECCs in corresponding blocks of a memory device, greater flexibility is provided in the use of ECCs for different blocks of the memory device. Some blocks are provided with greater length ECCs to provide greater memory protection, since those memory blocks may be associated with sources of memory errors that can result in larger amounts of memory errors.

Machine-readable instructions, such as modules 218 and 220 in FIG. 2, can be loaded for execution on a processing circuit (such as in the memory controller 204).

Data and instructions can be stored in respective storage devices, which can be implemented as one or multiple computer-readable or machine-readable storage media. The storage media include different forms of memory including semiconductor memory devices such as dynamic or static random access memories (DRAMs or SRAMs), erasable and programmable read-only memories (EPROMs), electrically erasable and programmable read-only memories (EE- PROMs) and flash memories; magnetic disks such as fixed, floppy and removable disks; other magnetic media including tape; optical media such as compact disks (CDs) or digital video disks (DVDs); or other types of storage devices. Note that the instructions discussed above can be provided on one computer-readable or machine-readable storage medium, or alternatively, can be provided on multiple computer-readable or machine-readable storage media distributed in a large system having possibly plural nodes. Such computer-readable or machine-readable storage medium or media is (are) considered to be part of an article (or article of manufacture). An article or article of manufacture can refer to any manufactured single component or multiple components. The storage medium or media can be located either in the machine running the machine-readable instructions, or located at a remote site from which machine-readable instructions can be downloaded over a network for execution.

In the foregoing description, numerous details are set forth to provide an understanding of the subject disclosed herein. However, implementations may be practiced without some or all of these details. Other implementations may include modifications and variations from the details discussed above. It is intended that the appended claims cover such modifications and variations.

What is claimed is:

1. A method of providing memory protection using a variable length error correction code, comprising:
    writing first data and a corresponding first error correction code to a first portion of a memory device;
    checking for an error in the first data and the first error correction code; and
    based on the checking, modifying the first error correction code to use for the first data stored in the first portion of the memory, wherein the modifying comprises one of removing a portion of the first error correction code or adding additional error correction code to use with the first error correction code.

2. The method of claim 1, further comprising:
    recording, in a mapping data structure, a location and length of a combination of the first data and the modified error correction code.

3. The method of claim 2, further comprising:
    in response to a request to write further data to the first portion of the memory device, determining a length of an error correction code to use for the further data by using the length retrieved from the mapping data structure.

4. The method of claim 1, further comprising:
    writing second data and a corresponding second error correction code to a second portion of the memory device starting at a location following the first data and the modified error correction code in the first portion;
    checking for an error in the second data and the second error correction code; and
    based on the checking for the error in the second data and the second error correction code, modifying the second error code to use for the second data stored in the second portion.

5. The method of claim 4, wherein the first data and the modified error correction code occupy a first storage space in the memory device, and wherein writing the second data and the second error correction code starts at the location immediately following the first storage space.

6. The method of claim 4, the second portion of the memory device starting at the location immediately following the first data and the modified error correction code in the first portion.

7. The method of claim 1, further comprising:
    determining that data and corresponding error correction code stored in the first portion exhibits an uncorrectable error; and
    sparing the first portion, wherein the sparing includes assigning a different physical region of the memory device to use as the first portion.

8. The method of claim 1, wherein modifying the first error correction code comprises truncating the first error correction code.

9. The method of claim 1, wherein modifying the first error correction code comprises generating a second error correction code based on a combination of the first data and the first error correction code.

10. The method of claim 9, further comprising storing a combination of the first data, the first error correction code, and the second error correction code in the first portion.

11. The method of claim 1, further comprising:
    after the writing, reading the first data and the first error code from the first portion of the memory device to perform the checking, wherein the reading is performed without any other intervening memory read or write between the writing and the reading.

12. A memory device comprising:
    a memory array to store blocks of data, wherein each of the blocks contains respective data and a corresponding error correction code, wherein the error correction code in a first of the blocks is of a length that is different from a length of the error correction code in a second of the blocks, and wherein the error correction code of a given one of the blocks is formed based on:
        writing the respective data and an initial error correction code in the given block,
        reading the respective data and the initial error correction code from the given block, and
        modifying the initial error correction code based on a detected error in the read data and initial error correction code, wherein modifying the initial error correction code comprises applying a change to the initial error correction code to produce a modified error correction code.

13. The memory device of claim 12, wherein the modified error correction code in the given block is a truncated version of the initial error correction code.

14. The memory device of claim 12, wherein the modified error correction code in the given block includes an additional error correction code generated based on the data and the initial error correction code in the given block.

15. The memory device of claim 12, wherein the reading occurs following the writing without any intervening memory read or write between the writing and the reading.

16. The memory device of claim 12, wherein the modified error correction code in the given block is of a length to cover the detected error and an error correction code budget for other types of error.

17. A system comprising:
    a memory device to store blocks of data and
    a memory controller to:
        write first data and a corresponding initial error correction code to a first of the blocks;
        read the first data and the corresponding initial error correction code from the first block;
        based on a detected error in the read first data and the corresponding initial error correction code, modify the initial error correction code by either truncating the initial error correction code or adding an additional error correction code;

write second data and a corresponding initial error correction code to a second of the blocks;

read the second data and the corresponding initial error correction code from the second block; and based on a detected error in the read second data and the corresponding initial error correction code from the second block, modify the initial error correction code of the second block, wherein the modified error correction code in the second block has a length different from the modified error correction code in the first block.

18. The system of claim 17, further comprising a mapping structure having entries corresponding to the blocks of the memory device, each of the entries containing a storage location of the respective block.

19. The system of claim 18, wherein each of the entries further contains a length of the respective block.

* * * * *

UNITED STATES PATENT AND TRADEMARK OFFICE
CERTIFICATE OF CORRECTION

| | |
|---|---|
| PATENT NO. | : 9,009,562 B2 |
| APPLICATION NO. | : 13/753902 |
| DATED | : April 14, 2015 |
| INVENTOR(S) | : Trezise et al. |

It is certified that error appears in the above-identified patent and that said Letters Patent is hereby corrected as shown below:

The title page showing the illustrative figure should be deleted to be replaced with the attached title page.

In the Drawings,

In the drawing sheets, consisting of Fig. 2, should be deleted to be replaced with the drawing sheet, consisting of Fig. 2, as shown on the attached pages.

In the Claims,

In column 8, line 57, in Claim 17, delete "data" and insert -- data; --, therefor.

Signed and Sealed this
Twenty-fifth Day of August, 2015

Michelle K. Lee
*Director of the United States Patent and Trademark Office*

CERTIFICATE OF CORRECTION (continued)

(12) United States Patent
Trezise et al.

(10) Patent No.: US 9,009,562 B2
(45) Date of Patent: Apr. 14, 2015

(54) PROVIDING MEMORY PROTECTION USING A MODIFIED ERROR CORRECTION CODE

(71) Applicant: Hewlett-Packard Development Company, L.P., Houston, TX (US)

(72) Inventors: Gregory Trezise, Wells Somerset (GB); Andrew Hana, Bristol (GB)

(73) Assignee: Hewlett-Packard Development Company, L.P., Houston, TX (US)

(*) Notice: Subject to any disclaimer, the term of this patent is extended or adjusted under 35 U.S.C. 154(b) by 128 days.

(21) Appl. No.: 13/753,902

(22) Filed: Jan. 30, 2013

(65) Prior Publication Data
US 2014/0215289 A1 Jul. 31, 2014

(51) Int. Cl.
*H03M 13/00* (2006.01)
*H03M 13/05* (2006.01)
*G06F 11/00* (2006.01)
*H03M 13/35* (2006.01)
*H03M 13/15* (2006.01)

(52) U.S. Cl.
CPC .......... *H03M 13/05* (2013.01); *G06F 11/00* (2013.01); *H03M 13/1515* (2013.01); *H03M 13/353* (2013.01); *H03M 13/6362* (2013.01)

(58) Field of Classification Search
CPC ........ G11C 29/00; H03M 13/00; H03M 13/05

USPC ............................................... 714/779, 758
See application file for complete search history.

(56) References Cited

U.S. PATENT DOCUMENTS

| | | | |
|---|---|---|---|
| 6,477,669 B1* | 11/2002 | Agarwal et al. | 714/708 |
| 6,851,081 B2* | 2/2005 | Yamamoto | 714/763 |
| 6,961,890 B2 | 11/2005 | Smith | |
| 6,986,095 B2* | 1/2006 | Maeda et al | 714/769 |
| 7,272,773 B2* | 9/2007 | Cargnoni et al. | 714/763 |
| 7,739,576 B2 | 6/2010 | Radke | |
| 7,810,017 B2* | 10/2010 | Radke | 714/769 |
| 8,037,380 B2 | 10/2011 | Cagno et al. | |
| 8,296,620 B2* | 10/2012 | Chen et al | 714/758 |
| 8,352,833 B2* | 1/2013 | Pekny et al | 714/763 |
| 8,473,815 B2* | 6/2013 | Chung et al | 714/766 |
| 8,782,493 B2* | 7/2014 | Keays et al | 714/765 |
| 2011/0113303 A1 | 5/2011 | Bedeschi et al | |
| 2012/0131422 A1 | 5/2012 | Shinbashi et al | |

OTHER PUBLICATIONS

Micron Technical Note, TN-29-63: Error Correction Code (ECC) in SLC NAND, May 2011 (12 pages)
Seroussi, Gadiel, A Systolic Reed-Solomon Encoder, IEEE Transactions on Information Theory, vol. 37, No. 4, Jul. 1991, pp 1217-1220.

* cited by examiner

*Primary Examiner* — Esaw Abraham
(74) *Attorney, Agent, or Firm* — Trop, Pruner & Hu, P.C.

(57) ABSTRACT

Data and a corresponding initial error correction code is written to a first portion of a memory device. Based on an error in the first data and the initial error correction code, the initial error correction code is modified.

19 Claims, 4 Drawing Sheets

FIG. 2